United States Patent
Coppens et al.

(10) Patent No.: US 7,026,060 B2
(45) Date of Patent: Apr. 11, 2006

(54) LAYERED STRUCTURE PROVIDING SHIELDING CHARACTERISTICS

(75) Inventors: Wilfried Coppens, Marke (BE); Hugo Lievens, Ghent (BE); Wim Van Vooren, Waregem (BE)

(73) Assignee: N.V. Bekaert S.A., Zwevegem (BE)

( * ) Notice: Subject to any disclaimer, the term of this patent is extended or adjusted under 35 U.S.C. 154(b) by 161 days.

(21) Appl. No.: 10/482,703

(22) PCT Filed: Jun. 28, 2002

(86) PCT No.: PCT/EP02/07259

§ 371 (c)(1),
(2), (4) Date: Jan. 2, 2004

(87) PCT Pub. No.: WO03/004261

PCT Pub. Date: Jan. 16, 2003

(65) Prior Publication Data

US 2005/0175854 A1 Aug. 11, 2005

(30) Foreign Application Priority Data

Jul. 3, 2001 (EP) .................................. 01202541

(51) Int. Cl.
*B32B 15/08* (2006.01)
*H05K 9/00* (2006.01)

(52) U.S. Cl. ........................ 428/626; 428/939; 427/404; 427/431; 264/244; 264/265; 264/328.17; 174/35 MS

(58) Field of Classification Search ..................... None
See application file for complete search history.

(56) References Cited

U.S. PATENT DOCUMENTS

| | | | |
|---|---|---|---|
| 3,439,231 A * | 4/1969 | Booe | ........................... 361/536 |
| 4,042,752 A | 8/1977 | Hage | |
| 4,510,208 A | 4/1985 | Kurfman | |
| 4,603,092 A | 7/1986 | Luch | |
| 4,871,319 A | 10/1989 | Babow | |
| 5,026,616 A | 6/1991 | Schumm, Jr. | |
| 5,114,812 A * | 5/1992 | Disselbeck et al. | .......... 429/234 |
| 5,212,350 A * | 5/1993 | Gebs | ..................... 174/102 R |
| 6,202,276 B1 * | 3/2001 | Chuang | ..................... 29/421.1 |

FOREIGN PATENT DOCUMENTS

| | | |
|---|---|---|
| EP | 0 454 311 A1 | 10/1991 |
| EP | 0 694 990 A1 | 1/1996 |
| WO | WO 93/15594 A1 | 8/1993 |
| WO | WO 99/40770 A1 | 8/1999 |

* cited by examiner

Primary Examiner—John J. Zimmerman
(74) Attorney, Agent, or Firm—Foley & Lardner LLP

(57) ABSTRACT

The invention relates to a layered structure comprising a plastic substrate, at least one intermediate metallic layer on top of this plastic substrate and a metal or metal alloy layer on top of this intermediate metallic layer. The metal or metal alloy layer is applied from the melt of a metal or metal alloy. The invention further relates to a method of manufacturing such a layered structure.

21 Claims, No Drawings

LAYERED STRUCTURE PROVIDING SHIELDING CHARACTERISTICS

FIELD OF THE INVENTION

The invention relates to a deformable layered structure providing excellent shielding against interfering radiation.

The invention further relates to a method of producing such a layered structure.

BACKGROUND OF THE INVENTION

Metallized plastic substrates have found applications in the shielding of interfering radiation such as electromagnetic interfering (EMI) radiation of for example electronic equipment.

Shielding is used either to protect an electronic equipment against external interfering radiation or to protect the environment from radiation generated by the electronic equipment itself.

Several techniques to metallize a plastic substrate are known in the art. Such techniques comprise for example the application of a conductive paint or the application of a coating by chemical processes such as immersion plating or electroless plating, electroplating, chemical vapour deposition, vacuum evaporation or sputtering.

Most of these coating techniques result in an expensive and complicated process.

Therefore, regarding the increasing need for metallized substrates, there is still a big demand for a simple and cheap method to produce metallized substrates.

Since the metallized substrate has to be formed into an object sized and shaped to enclose an electronic equipment, the metallized substrate shall have a high deformability.

WO 99/40770 describes a method of fabricating a support provided with shielding characteristics against interfering radiation. A tin layer is electrolytically applied on a plastic substrate. The thus obtained metallized plastic is placed in an injection mould and plastic is injected into the mould to form the support.

A drawback of the articles obtained by this method is their high cost since the application of a metal coating by electrolysis is an expensive process.

SUMMARY OF THE INVENTION

It is an object of the present invention to avoid the drawbacks of the prior art.

It is another object of the invention to provide a layered structure with good shielding properties that can easily be deformed without deteriorating the shielding characteristics.

It is also an object of the invention to provide a method to manufacture layered structures at low costs.

Futhermore, it is an object of the invention to provide a method of manufacturing a three-dimensional shaped shielding material.

According to a first aspect of the present invention a layered structure according to the present invention is provided.

The layered structure comprises a layered structure comprising:
  a plastic substrate;
  at least one intermediate metallic layer on top of said elongated plastic substrate;
  a metal or metal alloy layer deposited on top of said intermediate metallic layer.

The metal or metal alloy layer comprises a solidified layer applied from the melt of a metal or metal alloy.

A preferred method to apply the metal or metal alloy layer is by hot dip. Hot dip application of a metal or metal alloy layer comprises the dipping of a substrate in a molten metal or metal alloy bath.

Since the melting point of a plastic substrate is generally low and in many cases lower than the temperature of the molten metal bath, up to now the application of a hot dip coating on a plastic substrate was impossible.

According to the present invention, before the hot dip coating is applied on the plastic substrate, an intermediate metallic layer with a rather high melting point is applied on the plastic substrate. This intermediate metallic layer protects the plastic substrate from melting and shrinking during the hot dip treatment.

The metal or metal alloy layer may comprise any metal or metal alloy. Preferably, the metal or metal alloy layer has a relatively low melting point, for example a melting point lower than 450° C.

More preferably, the metal or metal alloy layer has a meting point lower than 300° C., for example lower than 250° C.

Preferred metal or metal alloys comprise tin or tin alloys or zinc or zinc alloys.

As tin alloys one can consider for example tin-lead alloys, tin-copper or tin-silver alloys. As zinc alloys one can consider for example zinc-aluminium alloys.

A tin or tin alloy layer offers the layered structure good shielding characteristics. These shielding characteristics can further be improved by adding an alloying element such as silver.

Tin is a metal with a low melting point and a high ductility.

It can easily be deformed. The good deformability of tin is an important characteristic since in many shielding applications it is required that the layered structure is deformed, for example three-dimensionally deformed.

Due to the high ductility of tin, the layered structure according to the present invention can be deformed, for example by deep-drawing, without creating cracks. The shielding characteristics do not deteriorate due to the deformation.

The thickness of the metal or metal alloy layer is preferably between 1 and 20, more preferably the thickness of the metal or metal alloy layer is between 1 and 15 µm, for example between 2 and 8 µm.

The metal or metal alloy layer applied by hot dip generally has at the surface of the layer a grain size of at least 5 µm, for example 10 µm.

The plastic substrate is preferably made of a thermoplastic material. Preferred plastic substrates are polyamides, polyimides, polyolefins such as polymers and copolymers of ethylene and propylene, polyetherimide, halogenated polyolefins such as polytetrafluoroethylene, polysufones, polycarbonates, polyesters, polyethylene terephtalate, polybutylene terephthalate, acrylonitrile-butadiene-styrene (ABS), polystyrene an polyvinylchloride.

Possibly one or more additives such as fillers are added to the plastic substrate. The function of a filler is for example to modify the modulus and stiffness of the substrate.

Examples of fillers are minerals, metals, metal oxides, metal salts and mixtures thereof.

Well known fillers are for example alumina, carbon black and quartz.

Other additives may comprise plasticizers, colorants and/or heat and light stabilizers.

The plastic substrate has preferably a thickness between 10 and 500 µm, for example 150 µm.

The plastic substrate can be an elongated plastic substrate such as a tape, a sheet or a foil.

The intermediate metallic layer preferably has a sufficiently high melting point to withstand the temperature of the molten metal or metal alloy and to protect the plastic substrate from shrinking during the application of the metal or metal alloy layer. Preferably, the intermediate metallic layer has a melting point higher than 500° C., more preferably the intermediate metallic layer has a melting point higher than 600° C.

The intermediate metallic layer can for example be a nickel layer, a copper layer, an aluminium layer, a cobalt layer or a chrome layer or the intermediate layer may comprise an alloy of one of these metals.

The thickness of the intermediate metallic coating is preferably between 0.025 and 2 µm. More preferably, the thickness of the intermediate metallic coating is between 0.1 and 1 µm, for example 0.2 µm.

The intermediate metallic layer can be applied by any technique known in the art for example by chemical plating, electroplating, spraying, evaporation, chemical vapour deposition or sputter deposition for example magnetron sputtering or ion beam sputtering.

A preferred technique to apply the intermediate coating is by sputter deposition.

Possibly, a number of intermediate metallic layers are deposited before a metal or metal alloy hot dip layer is applied.

In a preferred embodiment a first intermediate metallic layer deposited on the plastic substrate comprises a nickel layer; a second intermediate metallic layer deposited on said first intermediate metallic layer comprises a copper layer.

Possibly, an alloy layer is formed at the interface of the intermediate metallic layer and the hot dip metal or metal alloy layer.

Such an alloy layer is for example present at the interface of a copper layer as intermediate metallic layer and a hot dip applied tin or tin alloy layer since copper easily forms an alloy with tin.

The layered structure according to the present invention may be three-dimensionally deformed.

The layered structure provided by the present invention is in particular suitable to be used as shielding material against interfering radiation.

According to a second aspect of the present invention a method of manufacturing a layered structure is provided.

The method comprises the following steps:
providing a plastic substrate;
applying at least one intermediate metallic layer on said plastic substrate;
applying a metal or metal alloy layer on said intermediate metallic layer from the melt of a metal or metal alloy and solidifying this metal or metal alloy layer.

The metal or metal alloy layer is preferably applied by hot dip.

Preferred metal or metal alloy layers comprise tin or a tin alloy or zinc or a zinc alloy.

The method according to the present invention has the advantage over other methods known in the art that the layered structure can be manufactured at low costs.

The application of a coating by hot dip is more economic than the application of a coating by other techniques such as electrolysis.

The intermediate metallic layer can be applied by any technique known in the art for example by chemical plating, electroplating, spraying, evaporation, chemical vapour deposition or sputtering for example magnetron sputtering, ion beam sputtering.

A preferred method comprises the steps of:
providing a plastic substrate;
depositing a first intermediate metallic layer on said plastic substrate; said first intermediate metallic layer comprising nickel;
depositing a second intermediate metallic layer on said first intermediate metallic layer; said second intermediate metallic layer comprising copper;
applying a metal or metal alloy layer on said second intermediate metallic layer from the melt of a metal or metal alloy and solidifying this metal or metal alloy.

The metal or metal alloy layer is preferably applied by hot dip.

According to a third aspect of the present invention a method of manufacturing a shielding material is provided.

The method comprises the step of deforming a layered structure as described above and/or the step of placing this layered structure in an injection mould and injection-moulding a plastic material in the mould.

The deforming may comprise a three-dimensional deforming.

Since a layered structure according to the present invention can be deformed without deterioration of the shielding characteristics, a shielding material obtained by the above described method is characterized by good shielding characteristics.

A preferred deforming method comprises deep-drawing or thermoforming of the layered structure. The layered structure can be cold drawn or formed into to the desired shape. However, the layered structure is preferably heated for example to a temperature between 150 and 200° C. and more preferably to a temperature between 175 and 200° C. before being formed into the desired shape (thermoforming).

In a moulding operation the layered structure is placed in a mould. In a subsequent step the mould cavity is filled with a polymer flowing into the recesses of the mould.

A preferred method comprises the deforming of a layered structure according to the present invention, followed by a moulding operation.

According to a further aspect of the present invention, a shielding material obtainable by a deforming and/or moulding operation is provided.

The shielding material is for example a three-dimensionally shaped material such as a box or container. Such a box or container-like shielding material can serve as a housing to shield a device placed in the box or container-like shielding material.

A shielding material according to the present invention is in particular suitable to be used as shielding material in personal computers, mobile telephones or other electronic instruments

DESCRIPTION OF THE PREFERRED EMBODIMENTS OF THE INVENTION

The invention will now be described by means of a number of examples. It has to be understood that the invention will not be limited to any of the described embodiments.

A first example is a layered structure comprising a polycarbonate foil, a copper layer and a tin layer.

The polycarbonate foil has a thickness of 125 µm. The copper layer is applied on the polycarbonate film by sputter deposition. The thickness of the copper layer is 0.1 µm.

Subsequently, the polycarbonate foil coated with the copper layer is passed through a molten tin bath to apply the hot dip tin coating with a thickness of 5 µm. The temperature of the tin bath is preferably between 232 and 250° C.

Preferably, the polycarbonate foil coated with the copper layer is cooled before it is passed through the molten tin bath.

At the interface of the copper layer and the tin layer, a copper-tin alloy layer is formed. This alloy layer ensures a good adhesion of the tin to the coated polycarbonate foil.

The grains of the metal or metal alloy layer have a grain size between 10 and 20 µm.

No lasting damage of the plastic substrate could be observed after the application of the metal or metal alloy layer.

A second example comprises a polyetherimide foil, a sputter deposited nickel layer applied on the foil, a sputter deposited copper layer applied on the nickel coating and a hot dip tin coating applied on the copper coating.

The nickel and copper layer has for example a thickness of 0.05 or 0.1 µm, the tin layer has for example a thickness of 8 µm.

The invention claimed is:

1. A layered structure, said layered structure comprising a plastic substrate, at least one intermediate metallic layer on top of said plastic substrate and a metal or metal alloy layer on top of said intermediate metallic layer, wherein said metal or metal alloy layer comprises a solidified layer applied from the melt of a metal or metal alloy, wherein said metal or metal alloy layer has at its surface a grain size of at least 5 µm.

2. A layered structure according to claim 1, wherein said metal or metal alloy is applied by hot dip.

3. A layered structure according to claim 1, wherein said metal or metal alloy is selected from the group consisting of tin or tin alloys and zinc or zinc alloys.

4. A layered structure according to claim 1, wherein said metal or metal alloy layer has a thickness between 1 and 20 µm.

5. A layered structure according to claim 1, wherein said plastic substrate comprises a thermoplastic material.

6. A layered structure according to claim 1, wherein said plastic substrate has a thickness between 10 and 500 µm.

7. A layered structure according to claim 1, wherein said plastic substrate is an elongated plastic substrate.

8. A layered structure according to claim 1, wherein said intermediate metallic layer has a melting point higher than 500° C.

9. A layered structure according to claim 1, wherein said intermediate metallic layer comprises nickel, copper, aluminium, cobalt or chrome or an alloy of one of these metals.

10. A layered structure according to claim 1, wherein said intermediate metallic layer has a thickness between 0.025 and 2 µm.

11. A layered structure according to claim 1, wherein an alloy layer is formed at the interface of said intermediate metallic layer and said metal or metal alloy layer.

12. A layered structure according to claim 1, wherein said layered structure comprises two intermediate metallic layers, the first intermediate metallic layer comprising a nickel layer and the second intermediate metallic layer comprising a copper layer.

13. A layered structure according to claim 1, wherein said layered structure is three-dimensionally deformed.

14. A method of manufacturing a layered structure, said method comprising the steps of:
providing a plastic substrate;
applying at least one intermediate metallic layer on said plastic substrate;
applying a metal or metal alloy layer on said intermediate metallic layer from the melt of a metal or a metal alloy and solidifying said metal or metal alloy layer, wherein said metal or metal alloy layer has at its surface a grain size of at least 5 µm.

15. A method of manufacturing a layered structure, said method comprising the steps of:
providing a plastic substrate;
applying a first intermediate metallic layer on said plastic substrate; said first intermediate metallic layer comprising nickel;
applying a second intermediate metallic layer on said first intermediate metallic layer; said second intermediate metallic layer comprising copper;
applying a metal or metal alloy layer on said second intermediate metallic layer from the melt of a metal or a metal alloy and solidifying said metal or metal alloy layer, wherein said metal or metal alloy layer has at its surface a grain size of at least 5 µm.

16. A method according to claim 14, wherein said metal or metal alloy layer is applied by hot dip.

17. A method according to claim 14, wherein said intermediate metallic layer or layers is/are applied by chemical plating, electroplating, spraying, evaporation, chemical vapour deposition or sputtering.

18. A method of manufacturing a shielding material, said method comprising the step of deforming a layered structure, said layered structure comprising a plastic substrate, at least one intermediate metallic layer on top of said plastic substrate and a metal or metal alloy layer on top of said intermediate metallic layer, wherein said metal or metal alloy layer comprises a solidified layer applied from the melt of a metal or metal alloy and/or the step of placing said layered structure in an injection mould and injection-moulding a plastic material in the mould.

19. A method according to claim 18, wherein said deforming comprises deep-drawing or thermoforming.

20. A shielding material obtainable by applying a method according to claim 18.

21. A shielding material including the layered structure according to claim 1.

* * * * *